(12) United States Patent
Vacca et al.

(10) Patent No.: US 8,962,975 B2
(45) Date of Patent: Feb. 24, 2015

(54) SEALANT COMPOSITION

(71) Applicant: Saes Getters S.p.A., Lainate (IT)

(72) Inventors: Paolo Vacca, Milan (IT); Antonio Bonucci, Milan (IT); Marco Scoponi, San Giuseppe di Comacchio (IT)

(73) Assignee: Saes Getters S.p.A., Lainate (MI) (IT)

( * ) Notice: Subject to any disclaimer, the term of this patent is extended or adjusted under 35 U.S.C. 154(b) by 0 days.

(21) Appl. No.: 14/236,894

(22) PCT Filed: Mar. 8, 2013

(86) PCT No.: PCT/IB2013/051860
§ 371 (c)(1),
(2) Date: Feb. 3, 2014

(87) PCT Pub. No.: WO2013/144755
PCT Pub. Date: Oct. 3, 2013

(65) Prior Publication Data
US 2014/0166083 A1    Jun. 19, 2014

(30) Foreign Application Priority Data
Mar. 30, 2012  (IT) .............................. MI2012A0522

(51) Int. Cl.
*C09K 3/10* (2006.01)
*H01G 9/20* (2006.01)
*H01L 31/048* (2014.01)
*C08L 23/08* (2006.01)
*C08K 3/00* (2006.01)
*C08K 3/20* (2006.01)

(52) U.S. Cl.
CPC ........... *C09K 3/1006* (2013.01); *C08L 23/0815* (2013.01); *H01G 9/2077* (2013.01); *H01L 31/0481* (2013.01); *C08K 3/0033* (2013.01); *C08K 3/0041* (2013.01); *C08K 3/20* (2013.01); *Y02E 10/542* (2013.01)
USPC ........................... 136/251; 524/517; 524/433

(58) Field of Classification Search
CPC . C09K 3/1006; H01L 31/0481; H01G 9/2077
See application file for complete search history.

(56) References Cited

U.S. PATENT DOCUMENTS

2006/0201544 A1  9/2006  Inoue
2008/0115825 A1  5/2008  Patel et al.

FOREIGN PATENT DOCUMENTS

| EP | 2270077 | 1/2011 |
|---|---|---|
| WO | 98/09808 | 3/1998 |
| WO | 2009/036752 | 3/2009 |
| WO | 2011/047185 | 4/2011 |

OTHER PUBLICATIONS

International Search Report mailed on Jun. 26, 2013 for PCT/IB2013/051860 filed on Mar. 8, 2013 in the name of Saes Getters S.P.A.
Written Opinion mailed on Jun. 26, 2013 for PCT/IB2013/051860 filed on Mar. 8, 2013 in the name of Saes Getters S.P.A.

*Primary Examiner* — Ling Choi
*Assistant Examiner* — Catherine S Branch
(74) *Attorney, Agent, or Firm* — Steinfl & Bruno, LLP

(57) ABSTRACT

A sealant composition for insulation of devices that are sensitive to penetration of moisture from the external environment is described. The sealant composition has ethylene-octene copolymers, a maleic anhydride modified polyolefin, an ethylene-vinyl acetate copolymer, at least one inert filler, at least one moisture scavenger, and at least one stabilizing or antioxidant preserving agent.

16 Claims, No Drawings

SEALANT COMPOSITION

CROSS REFERENCE TO RELATED APPLICATIONS

The present application is the US national stage of International Patent Application PCT/IB2013/051860 filed on Mar. 8, 2013 which, in turn, claims priority to Italian Patent Application MI2012A000522filed on Mar. 30, 2012.

The present invention relates to a sealant composition for the isolation of devices that are sensitive to permeation of moisture from the external environment.

It is well known that the insulating structures for moisture-sensitive devices are made with the aid of sealants compositions having a low rate of water vapor transmission.

In particular, it is known that the functionality of photovoltaic panels may be reduced in the event of permeation of moisture inside the panel. Thus, to prevent such permeation, insulating structures for photovoltaic devices are known, which comprise a plurality of plates, made of glass or other moisture impervious material, which are joined at the edge zone by means of a spacer made of metallic material. Between the sides of the spacer facing the glass plates and the inner surfaces of the plates a sealant composition is employed, having the purpose of forming a barrier against the entrance of the molecules of moisture within the photovoltaic panel. Sealant compositions used in photovoltaic panels, as well as in other devices sensitive to moisture, are subjected to thermal cycles, for example in the steps of the manufacturing processes of the panels or devices. Therefore, obtaining formulations with thermodynamic stability up to temperatures of 120-130° C. is an advantage.

The known sealant compositions generally include olefin polymers modified with silanes as adhesion promoters.

International Publication WO2009/036752 describes a primary sealant composition comprising:

a) from 30% to 60% by weight, preferably from 40% to 50% by weight of olefin polymers having number average molecular weight between 400 and 600,000 D, preferably between 5,000 and 300,000 D;

b) from 2% to 35% by weight, preferably from 5% to 25% by weight of a modified polymer;

c) from 5% to 40% by weight, preferably from 10% to 30% by weight of inert fillers;

d) from 5% to 25% by weight, preferably from 10% to 15% by weight of moisture sorbers, and e) from 0% to 3% by weight of preservatives, in particular antioxidants agents or UV-rays protecting agents.

As olefinic polymers of high molecular weight, the use of polyisobutylene, polybutene, butyl rubber (polyisobutylene-isoprene), block copolymers of styrene, in particular SBS, SIS, SEBS, SEPS, SIBS, SPIS, also in modified form and copolymers and/or terpolymers of amorphous a-olefins is described.

As modified polymers, the use of polyolefins modified with silanes is described.

International Publication WO2011/047185 describes a sealant composition for photovoltaic devices having the following composition:

a) unsaturated or reactive polyolefins or combinations thereof in an amount from about 10% to 80% by weight with respect to the composition;

b) olefinic polymers or combinations thereof in an amount from about 5% to about 80% by weight with respect to the composition;

c) at least one filler in an amount from about 10% to about 60% by weight with respect to the total composition;

d) at least a moisture sorber in an amount from about 2.5% to about 25% by weight with respect to the total composition, and e) at least one preserving agent comprising an antioxidant and/or a UV stabilizer in an amount from about 0.1% to about 3% by weight of the total composition.

The composition preferably further comprises a polymer modified with silanes in amounts of from 5% to 30% by weight of the total composition.

However, the magnitude of the effect of promoting adhesion generated from the polymers modified with silanes depends on the other components of the sealant composition as well as by the materials to be sealed. Therefore, the sealant compositions comprising polymers modified with silanes have a limited applicability in relation to the materials of destination and they require special caution with regard to their storage.

Furthermore, despite the efforts that were made so far, the need for a sealant composition having a high thermal stability and a low rate of water vapor transmission (MVT) continues to exist.

The purpose of the present invention is therefore to provide a sealant composition free from the above mentioned drawbacks and having a high thermal stability and a low rate of water vapor transmission (MVT). Said object is achieved with a sealant composition whose main features are specified in the first claim, a use whose features are specified in claim 13, and a solar module whose characteristics are specified in claim 15. Other features of the composition, the use and the module are specified in the remaining claims.

The composition according to the present invention comprises:

a maleic anhydride modified polyolefin;
at least one ethylene-octene copolymer;
an ethylene-vinyl acetate copolymer;
at least an inert filler;
at least a moisture sorber, and
at least a stabilizing or antioxidant preserving agent.

Preferably, in the composition according to the present invention the above mentioned components sum up to at least 95% of the weight of the overall composition to be used as a sealant in the production process of a device sensitive to moisture.

The inventors have found that the selection of above indicated components, and in particular the combination of a polyolefin modified with maleic anhydride and an ethylene octane copolymer, allows to obtain a composition having an excellent sealant effectiveness regardless of the presence of polyolefins modified with silanes. According to one aspect of the invention, therefore, the composition object of the present invention does not include polyolefins modified with silanes.

Furthermore, the compositions according to the present invention show a high thermal stability and a low rate of water vapor transmission (WVT).

Furthermore, the presence of an ethylene-vinyl acetate copolymer induces an increase in adhesion properties following the application of a compression force even after cooling of the adhesive sealant, resulting in improved performances as tacking and pressure sensitive adhesive.

In the composition according to the present invention the weight ratio between the amount of said ethylene-octene copolymer and said polyolefin modified with maleic anhydride is advantageously between 1:1 and 10:1, more preferably between 3:1 and 8:1, still more preferably between 4:1 and 6:1.

Preferably, said polyolefin modified with maleic anhydride is a copolymer of polyethylene/polypropylene grafted with maleic anhydride having an index MFI (acronym for "melt flow index") greater than 1 g/10 min and a density between 0.87 and 0.96 g/cc. The MFI index is a parameter that identifies the fluidity of the polymeric material in the molten state at a specific temperature and with a defined applied pressure and which can be evaluated in accordance with the ISO 1133 international procedure, similarly to the density of the same compositions generally evaluated in accordance with the international ASTM D 792.

Preferably said ethylene-octene copolymers are characterized by a degree of crystallinity between 10 and 35%, more preferably between 15 and 25%, a density between 0.86 and 0.90 g/cc and an MFI index equal to or greater than 5 g/10 min.

Preferably, said ethylene-vinyl acetate copolymer has a high content of vinyl acetate (greater than 30% by weight) and has an MFI index higher than 30 g/10 min.

In one alternative embodiment the above mentioned ethylene-octene copolymer is used in combination with a second ethylene-octene copolymer having higher MFI index, preferably greater than 30 g/10 min As inert fillers, the composition according to the present invention may comprise gypsum, silicates, silicon oxides, titanium oxide and carbon black. An alternative composition according to the invention comprises a mixture of talc and carbon black. In a particularly advantageous way, is used a mixture of talc and carbon black in a proportion by weight of between 6:1 and 8:1, more preferably between 2:1 and 4:1.

As moisture sorbers, the compounds commonly used in the sealant compositions for isolation of devices can be used, for example powders of one or more compounds selected from the group consisting of alkaline earth metal oxides and aluminosilicates. Alkaline earth metal oxides are preferably selected from the oxides of lithium, calcium, strontium, barium, magnesium. Preferably, as moisture sorbers calcium oxide and magnesium oxide are used.

The preservatives preferably used in the composition according to the present invention are selected from the group consisting of sterically hindered phenols, hindered amines and mercapto compounds, whereas benzophenone and benzotriazole might be commercially available antioxidant preserving agent suitable to be used in the composition according to the present invention.

According to a preferred embodiment of the invention, the sealant composition comprises:
  said polyolefin modified with maleic anhydride in an amount between 5% and 20% by weight, more preferably between 8% and 10% by weight, relative to the total weight of the composition;
  said ethylene-octene copolymer in an amount comprised between 40% and 60% by weight, more preferably between 50% and 55% by weight, relative to the total weight of the composition;
  said ethylene-vinyl acetate copolymer in an amount comprised between 0.5% and 5% by weight, more preferably between 1% and 4% by weight, relative to the total weight of the composition;
  said at least one inert filler in an amount comprised between 1% and 30% by weight, more preferably between 1% and 4% by weight, relative to the total weight of the composition;
  said at least one moisture absorbent in a quantity comprised between 20% and 40% by weight, more preferably between 25% and 35% by weight relative to the total weight of the composition, and
  said at least one preserving agent in an amount between 0.5% and 5% by weight, more preferably between 1% and 3% by weight, relative to the total weight of the composition.

The composition according to the present invention advantageously further comprises at least one flame retardant, preferably consisting of magnesium hydroxide.

Said flame retardant is present in the composition according to a preferred embodiment of the invention in an amount between 0.5% and 3% by weight relative to the total weight of the composition.

The sealant composition according to the invention can be formulated in a unique mixture that is usable as such, or in two pre-mixtures to be mixed immediately before use by the end user.

The sealant composition according to the present invention is advantageously used to manufacture insulation structures for any device sensitive to moisture, such as for example electronic devices, photosensitive devices, medical devices with particular reference to pacemakers, organic electroluminescent devices, with particular reference to OLED and OLET devices, solid state photoelectrochemical solar cells (SSPECs) and dye sensitized solar cells (DSSCs), as well as solar panels comprising at least one photovoltaic cell.

In one aspect, the invention further relates to a solar panel comprising at least one photovoltaic cell interposed between at least a first substrate and at least a second substrate, for example a sheet of glass, metal or other material impervious to moisture. A composition according to the present invention is positioned as a sealant between said first substrate and said second substrate, as well as any additional elements such as a spacer made of metallic material.

The invention is illustrated by the following non-limiting examples:

EXAMPLE 1

A polymer composition according to the present invention was obtained from a mixture of DOW Engage ® 8411 type polyethylene (1-octene), a DOW Amplify™ TY 1351 type polyolefin modified with maleic anhydride, a Arkema Evatane ® 33-45 type random copolymer of ethylene-vinyl acetate produced through radical high-pressure polymerization, and a ethyleneglycol bis [3,3-bis (3-tert-butyl-4-hydroxyphenyl) butyrate] type preserving agent, in proportions by weight, respectively, of 100:19:6:3.

The thus obtained mixture was heated to a temperature of about 220° C. in a thermostated chamber containing two counterrotating tools set to a constant rotational speed (twin-screw system) and kept in rotation for 3 minutes.

Then, a mixture of talc and carbon black in 10:1 ratio and a mixture of CaO and MgO in a 2:1 ratio, respectively for amounts of 6% and 28% compared to the total weight of the thus obtained composition, were added. The mixture was then maintained in rotation at constant speed and a flame retardant in an amount corresponding to 2% by weight with respect to the composition was then added. The temperature was increased up to 245° C.

The composition was cooled and subjected to characterization by differential scanning calorimetric analysis in order to assess the range of the temperatures of phase transition, identified between 26 and 137° C. as a result of the crystalline phase melting.

In addition, the glass adhesion properties were determined as follows. A 0.3 mm thick sample was prepared through lamination process at 150° C. on glass specimens with overlapping section of 25*10 mm. The sample was subjected to a tensile test, applying a pre-load of 1N for 10s (preload speed of 1 mm/min) and then a load cell of 10 kN (also this with a test speed of 1 mm/min).

The test result showed a high adhesion to glass for a minimum adhesion force of 1250N for a specimen thickness of 0.3 mm.

EXAMPLE 2—COMPARATIVE

The process described in Example 1 was repeated with the only difference that no ethylene-vinylacetate copolymer was added. Thus, a polymer composition identical to that described in Example 1 was prepared, but devoid of any ethylene-vinyl acetate copolymer.

The resulting composition was subjected to lap shear test in order to determine the adhesion properties on glass. The test result showed a high adhesion to glass for a minimum adhesion force of 1140N for a specimen thickness of 0.3 mm. This value shows a reduction of 10% of the adhesion properties, compared to the formulation employing ethylene-vinyl acetate copolymer.

EXAMPLE 3—COMPARATIVE

A polymer composition was obtained by the method of preparation described in example 1, but using, as the sole polymeric component, poly(isobutylene) having a weight-average molar mass of 60,000 g/mol. The above-mentioned polymeric component and a preserving agent, talc, carbon black and calcium oxide in similar proportions by weight to those used for examples 1 and 2 were introduced in a thermostated chamber containing two counterrotating tools set to a constant speed. The analysis in differential scanning calorimetry shows a reversible endothermic transition due to the melting of a limited crystalline fraction between 36 and 120° C. melting. This analysis shows that above 120° C. the material is completely melted with a consequent drastic reduction of the mechanical properties.

The invention claimed is:

1. A sealant composition for insulation of moisture sensitive devices, comprising:
    at least one ethylene-octene copolymer;
    a maleic anhydride modified polyolefin;
    an ethylene-vinyl acetate copolymer;
    at least one inert filler;
    at least one moisture scavenger; and
    at least one stabilizing or antioxidant preserving agent.

2. The composition according to claim 1, wherein weights of said ethylene-octene copolymer, maleic anhydride modified polyolefin, ethylene-vinyl acetate copolymer, inert filler, moisture scavenger and preserving agent sum up to at least 95% of a total weight of the composition.

3. The composition according to claim 1, wherein said maleic anhydride modified polyolefin is a polyethylene/polypropylene copolymer modified with maleic anhydride.

4. The composition according to claim 3, wherein said polyethylene/polypropylene copolymer modified with maleic anhydride has a Melt Flow Index higher than 1 g/10 min and a density of between 0.87 and 0.96 g/cc.

5. The composition according to claim 1, wherein said ethylene-octene copolymer has a melt Flow Index equal or higher than 5 g/10 min.

6. The composition according to claim 5, further comprising a second ethylene-octene copolymer, said second ethylene-octene copolymer having a melt Flow Index equal or higher than 30 g/10 min.

7. The composition according to claim 1, wherein said ethylene-vinyl acetate copolymer has a vinyl acetate content higher than 30% by weight and a Melt Flow Index higher than 30 g/10 min.

8. The composition according to claim 1, wherein said at least one inert filler comprises a mixture of talc and carbon black in weight proportion of between 6:1 and 8:1.

9. The composition according to claim 1, wherein said at least one moisture scavenger comprises powders of one or more compounds selected among lithium oxide, calcium oxide, strontium oxide, barium oxide, magnesium oxide and aluminosilicates.

10. The composition according to claim 9, wherein said at least one moisture scavenger comprises calcium oxide and magnesium oxide.

11. The composition according to claim 1, further comprising at least one flame retardant.

12. The composition according to claim 1, wherein:
    said maleic anhydride modified polyolefin is in an amount of between 5% and 20% by weight with respect to the total weight of the composition;
    said ethylene-octene copolymer is in an amount of between 40% and 60% by weight with respect to the total weight of the composition;
    said ethylene-vinyl acetate copolymer is in an amount of between 0.5% and 5% by weight with respect to the total weight of the composition;
    said at least one inert filler is in an amount of between 1% and 30% by weight with respect to the total weight of the composition;
    said at least one moisture scavenger is in an amount of between 20% and 40% by weight with respect to the total weight of the composition; and
    said at least one stabilizing or antioxidant preserving agent is in an amount of between 0.5% and 5% by weight with respect to the total weight of the composition.

13. The composition according to claim 12, wherein
    said maleic anhydride modified polyolefin is in an amount of between 8% and 10% by weight with respect to the total weight of the composition;
    said ethylene-octene copolymers is in an amount of between 50% and 55% by weight with respect to the total weight of the composition;
    said ethylene-vinyl acetate copolymer is in an amount of between 1% and 4% by weight with respect to the total weight of the composition;
    said at least one inert filler is in an amount of between 1% and 10% by weight with respect to the total weight of the composition;
    said at least one moisture scavenger is in an amount of between 25% and 35% by weight with respect to the total weight of the composition;
    said at least one stabilizing or antioxidant preserving agent is in an amount of between 1% and 3% by weight with respect to the total weight of the composition; and
    said at least one flame retardant is in an amount of between 0.5% and 3% by weight with respect to the total weight of the composition.

14. Use of a composition according to claim 1 as sealant in a moisture sensitive device.

15. A solar module comprising:
    at least one among photovoltaic cells,
    photoelectrochemical solar cells (SSPECs), and
    dye sensitized solar cells (DSSCs),
    at least one first substrate and at least one second substrate, and the composition according to claim 1, positioned between said first substrate and said second substrate.

16. The composition according to claim 1, wherein said at least one inert filler comprises a mixture of talc and carbon black in weight proportion of between 2:1 and 4:1.

\* \* \* \* \*